(12) United States Patent
Lee

(10) Patent No.: US 6,483,766 B2
(45) Date of Patent: Nov. 19, 2002

(54) INTERFACE CIRCUIT FOR USING IN HIGH-SPEED SEMICONDUCTOR DEVICE AND INTERFACING METHOD

(75) Inventor: Young-Dae Lee, Songnam (KR)

(73) Assignee: Samsung Electronics Co., Ltd., Suwon (KR)

( * ) Notice: Subject to any disclaimer, the term of this patent is extended or adjusted under 35 U.S.C. 154(b) by 3 days.

(21) Appl. No.: 09/726,998

(22) Filed: Nov. 30, 2000

(65) Prior Publication Data

US 2002/0009013 A1 Jan. 24, 2002

(30) Foreign Application Priority Data

Jul. 19, 2000 (KR) .............................. 00-41236

(51) Int. Cl.[7] .............................. G11C 8/80
(52) U.S. Cl. .................. 365/230.06; 365/83; 365/68
(58) Field of Search .................. 365/230.06; 326/83, 326/68

(56) References Cited

U.S. PATENT DOCUMENTS

| | | | |
|---|---|---|---|
| 5,650,971 A | * 7/1997 | Longway et al. | ............ 365/207 |
| 5,786,711 A | * 7/1998 | Choi | .......................... 326/83 |
| 6,094,083 A | * 7/2000 | Noda | .......................... 327/333 |
| 6,307,397 B1 | * 10/2001 | Mueller et al. | ................ 326/81 |
| 6,344,764 B2 | * 2/2002 | Tanzawa | ...................... 327/333 |

* cited by examiner

*Primary Examiner*—David Nelms
*Assistant Examiner*—Connie C. Yoha
(74) *Attorney, Agent, or Firm*—F. Chau & Associates, LLP

(57) ABSTRACT

The present invention discloses an interface circuit suitable for a high-speed semiconductor device. The interface circuit includes an input driver producing a first and second output signal having opposite phases to each other by receiving an external power supply voltage as an operation voltage and buffering an input signal to the level of the external power supply voltage; a cross-coupled sense amplifier for receiving an internal power supply voltage as an operation voltage when a control signal is in the first transition state, and performing a differential amplification by receiving the first output signal at a first input end and receiving the second output signal at a second input end; an output potential fixation element for keeping a potential of an output end of the cross-coupled sense amplifier at a uniform potential corresponding to a level of the internal power supply voltage only when the control signal is in the second transition state; and an output driver for receiving the internal power supply voltage as an operation voltage and buffering the output signal at the output end into the level of the internal power supply voltage to be applied into a circuit in the chip.

6 Claims, 4 Drawing Sheets

INTERFACE CIRCUIT FOR USING IN HIGH-SPEED SEMICONDUCTOR DEVICE AND INTERFACING METHOD

BACKGROUND OF THE INVENTION

1. Field of the Invention

The present invention relates to an interface for a semiconductor device, and more particularly to an interface circuit and an interfacing method suitable for a high-speed semiconductor device.

2. Discussion of Related Art

As the operational speed of semiconductor chips increase, the need for a low power supply voltage and high-speed interface-circuits also increase. A lower supply voltage decreases power dissipation and reduces transmission line effects in high-speed operations. There has been a trend towards decreasing the power supply voltage applied to high speed semiconductor chips, for example, from 5 volts (V) to 3.3V, 2.5V, or less than 2.5V. For example, for a highly integrated semiconductor device having a gate poly size of less than 0.18 $\mu$m, and employing a dual oxide manufacture process to form a thin tunnel oxide, the internal power supply voltage is about 1.8V. Integrated circuit chips typically include an internal voltage controller for dropping the external power supply voltage applied from an exterior to the internal voltage needed for internal circuits. For example, a random access memory (RAM) is described with a voltage reduction circuit mounted as an internal voltage controller for reducing the voltage applied to an internal circuit in Japanese Patent Publication No. 9-270191.

An input receiver can be used as an interface circuit for buffering an external signal to a level appropriate for the internal circuits of a semiconductor chip. As its name implies, an interface circuit operates between the internals of an integrated circuit and any external components. The voltage levels output, and setup and hold times are important parameters of an input receiver.

Typically, the input receiver is designed to have a signal interface such as a LVTTL, HSTL, or GTL, according to the needs of the particular semiconductor device. The LVTTL interface is commonly used in current designs.

For example, an LVTTL interface wherein the external power supply voltage (hereinafter, EXTVDD) is 3.3V (or 2.5V), while the internal power supply voltage is 1.8V or some voltage less than EXTVDD. The reduced internal voltage provides a decrease in transition time with increased speed and a decreased operation current.

However, in the case of an internal power supply voltage less than EXTVDD-1Vt (Vt is a threshold voltage), the rising/falling time of an input signal is about 1v/1n, and a high level of the input signal is higher than the internal power supply voltage+1Vt, there is a problem in that the setup and hold time cannot be satisfied with accuracy. That is, when the level of the internal power supply voltage is about 1.8V, with a swing between Vil=0V and Vih=3V, and the rising/falling time of the input signal is about 1v/1n, the input receiver operates only when the level of the input signal is less than the internal power supply voltage-1vt at a transition from the high level to the low level. Accordingly, the rising/falling time of 1v/1n and the voltage swing at the LVTTL interface makes satisfaction of the setup/hold time tSU/tHD and optimization of a current consumption difficult.

Conventional input receivers are explained with reference to FIGS. 1 to 3. FIG. 1 shows an input receiver which includes p type and n type channel metal-oxide semiconductor (MOS) transistors PM1, PM2, NM1, NM2, a p-type channel MOS transistor PM3 and an inverter chain 20. The inverter type input receiver receives an input signal XAi through gates of the p type and n type channel MOS transistors PM2, NM1. A control signal ZZB applied to the gate of NM2 puts the receiver in a waiting current mode. When the control signal ZZB is applied at a level turning on the MOS transistor NM2 and the input signal XAi is applied at a low level. Node NO1 is pulled up to EXTVDD at a logic "high", which is applied to inverter I1 of the inverter chain 20. An internal power supply voltage IVC is applied to the inverter chain 20. Although the inverse output signal is buffered to the level of the internal power supply voltage by the inverter chain 20 and a delay of the output signal OUT is adjusted to suit a phase of a clock signal, the delay is difficult to adjust accurately for each transition. For example, when a rising/falling time of the input signal (hereinafter RFF) is 1v/1n and the input signal swings between 0V and 3V (here, the external power supply voltage is 3.3V and the internal power supply voltage is 1.8V), H-L time (or L-H time) becomes "1.5ns(EXTVDD-IVC)+PMOS Vt/RFT" in order to turn on PMOS at the first stage of the inverter (or the second stage), and therefore application of this receiver in a high-speed semiconductor device is not suitable. Accordingly, as shown in FIG. 1, when the input signal XAi is changed from low level to high level (or vise versa), it is difficult to adjust each delay. In addition, when the internal power supply voltage is less than EXTVDD—1Vt and a rising/falling time of an input signal is large and a high level of the input signal is more than the internal power supply voltage+1Vt, the above described input receiver cannot meet the setup/hold time tSU/tHD requirements.

With respect to FIG. 2, an amplifier type input receiver is shown for sensing voltage, including an inverter chain 20 and a current mirror type differential amplifier including P type and N type channel MOS transistors PM10, PM11, NM10, NM11, NM12, and NM13. In the input receiver shown in FIG. 2, an input signal XAi is input to a gate of n type channel MOS transistor NM10 as the first input signal, and a reference signal REFi is input to a gate of n type channel MOS transistor NM11 as the second input signal. The reference signal REFi and a control signal ZZB are applied to the gates of the n type channel MOS transistors NM12, NMI3, respectively. The current mirror type differential amplifier CDA functions as a voltage sense amplifier for sensing voltage. Here, the reference signal REFi is a reference voltage signal formed in a semiconductor device. As in FIG. 1, the input receiver structure of FIG. 2 also has a problem when the internal power supply voltage is less than EXTVDD—1Vt, a rising/falling time of an input signal is large, and a high level of the input signal is more than the internal power supply voltage+1Vt. That is, where an output signal at an output node NO11 of the sense amplifier is applied to the delay chain 20 to be changed to a level of the internal power supply voltage. A driving capability of a driver transistor constituting the delay chain can be variable when the output signal of the sense amplifier CDA is changed from the high level to the low level.

With respect to FIG. 3, similarly to FIG. 2, an input receiver is shown which includes an inverter chain 20 and a current mirror type differential amplifier CDA including an inverter 110 and p type and n type channel MOS transistors PM10, PM11, NM10, NM11, NM13. The input receiver shown in FIG. 3 receives an input signal XAi through a gate of the n type channel MOS transistor NM10 as the first input signal, and receives an inverted signal of the input signal XAi through a gate of the n type channel MOS transistor NM11 as the second input signal. To a gate of the n type channel MOS transistor NM13 acting as a current source is applied a control signal ZZB. This current mirror type differential amplifier CDA functions as a voltage sense amplifier for sensing voltage. The input receiver of FIG. 3 has a driving power supply for the differential amplifier CDA and an inverter inverting the first input signal Xai. The input receiver is powered by the external power supply voltage EXTVDD, and a driving power supply of the delay chain 20 receiving an output signal at the output node NO11 of the sense amplifier is powered by the internal power supply voltage, whereby this also has the same problem as mentioned with respect to FIGS. 1 and 2.

Accordingly, a need exists for an input receiver which is capable of meeting setup/hold time requirements, having a low consumption of DC current even when the internal power supply voltage is less than EXTVDD minus a threshold voltage, a rising/falling time of an input signal is large, and a high level of the input signal is more than the internal power supply voltage plus a threshold voltage.

SUMMARY OF THE INVENTION

An object of the present invention is to provide a high-speed interface circuit suitable for a high-speed semiconductor device.

Another object of the invention is to provide an input receiver which keeps a tight setup/hold time with a low consumption of DC current even when the internal power supply voltage is less than the external power supply voltage minus a threshold voltage, a rising/falling time of an input signal is large, and a high level of the input signal is more than the internal power supply voltage plus a threshold voltage.

Still another object of the invention is to provide an input circuit having a good interface capability and low leakage of current while increasing (or maximizing) a transition speed and a method thereof.

According to one embodiment of the present invention, an interface circuit is provided for a semiconductor device, wherein the interface circuit includes an input driver producing a first and second output signal having opposite phases to each other by receiving an external power supply voltage as an operation voltage and buffering an input signal to the level of the external power supply voltage. The interface circuit also includes a cross-coupled sense amplifier for receiving an internal power supply voltage as an operation voltage when a control signal is in the first transition state, and performing a differential amplification by receiving the first output signal at a first input end and receiving the second output signal at a second input end. An output potential fixation element is also provided as part of the interface circuit for keeping a potential of an output end of the cross-coupled sense amplifier at a uniform potential corresponding to a level of the internal power supply voltage only when the control signal is in the second transition state. The interface circuit also includes an output driver for receiving the internal power supply voltage as an operation voltage and buffering the output signal at the output end into the level of the internal power supply voltage to be applied into a circuit in the chip.

In addition, according to another embodiment of the present invention, a semiconductor device uses a first power supply voltage and a second power supply voltage less than the first power supply voltage minus a threshold voltage, a method for interfacing an input signal to swing to a level of the first power supply voltage includes; a step of producing the first, the second output signal having opposite phases to each other by buffering the input signal with a use of the first power supply voltage as a driving power supply; a step of performing a level shifting through an cross-coupled type differential amplifier by using the second power supply voltage as a driving power supply and receiving the first output signal at a first input end and receiving the second output signal at a second input end; a step for finally outputting an output signal by buffering the level-shifted output signal to the level of the second power supply voltage with a use of the second power supply voltage as a driving power supply.

According to the invention explained above, advantages of the present invention include a high-speed response feature, the satisfaction of a setup/hold time requirement, and reduced DC current consumption when the internal power supply voltage is less than the external power supple voltage minus a threshold voltage and a rising/falling time of an input signal is large and a high level of the input signal is more than the internal power supply voltage plus a threshold voltage.

Above mentioned objects and other objects, features and advantages of the invention will be more clear in a detail description for preferable embodiments of the invention which is explained hereinafter in regard to appended drawings. It should be noted that the same or similar parts in figures are represented with the same or similar reference marks for the convenience's sake for an explanation and understanding.

BRIEF DESCRIPTION OF THE DRAWINGS

Prior Art

Prior Art

Prior Art

DETAILED DESCRIPTION OF PREFERRED EMBODIMENTS

According to one embodiment of the present invention an input receiver is provided having a short setup/hold duration and low DC current consumption, even when the internal power supply voltage is less than the external power supple voltage minus a threshold voltage, the duration of the rising/falling input signal is large, and a high level of the input signal is more than the internal power supply voltage plus a threshold voltage.

Figure 4:
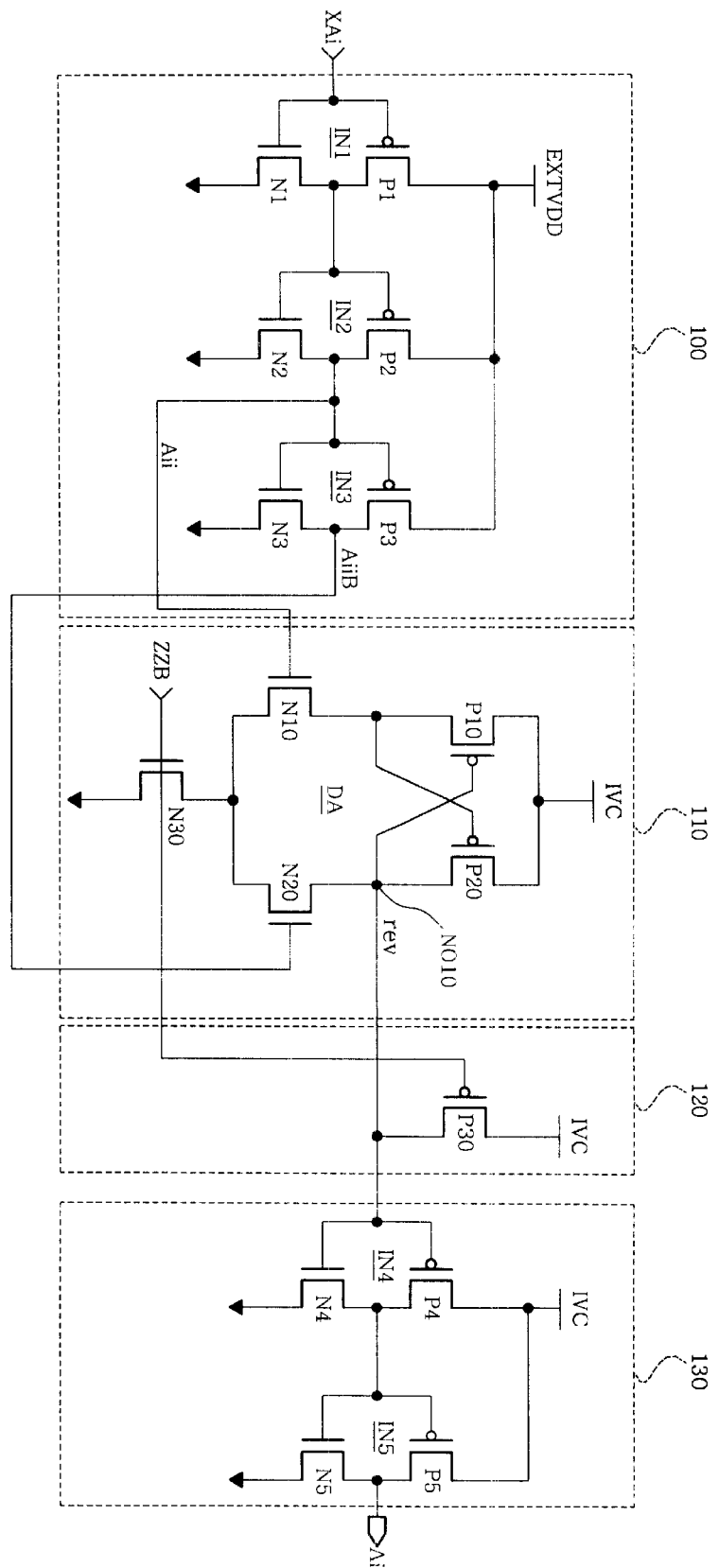
FIG. 4 is a diagram showing an input receiver circuit according to an embodiment of the present invention.

Referring to FIG. 4, an input receiver according to the present invention is used as an interface circuit including an input driver 100 positioned at a first stage, a cross-coupled sense amplifier 110 positioned at a second stage, an output potential fixation element 120 positioned at a third stage, and an output driver 130 at a fourth stage.

Figure 1:
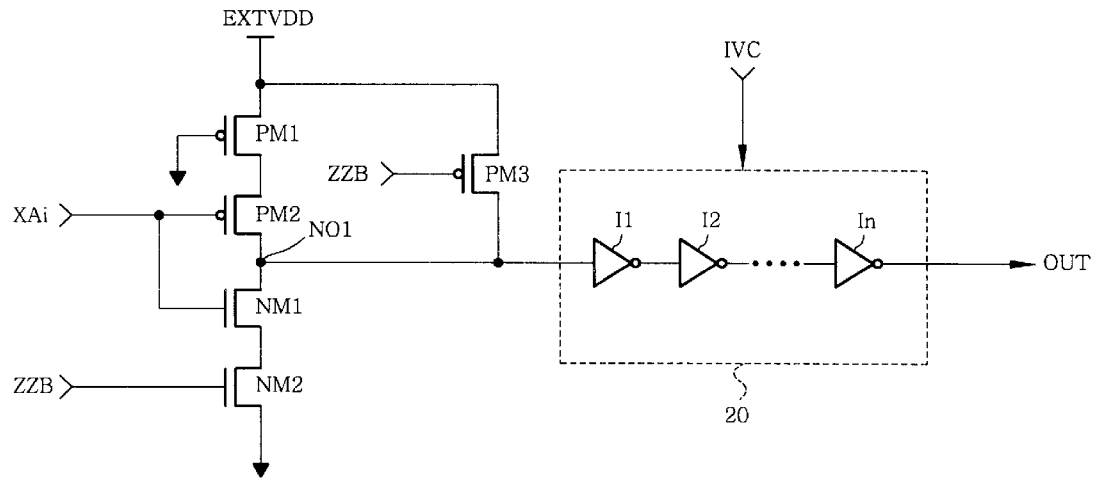
FIG. 1 is a circuit diagram of a conventional input receiver circuit.
Figure 2:
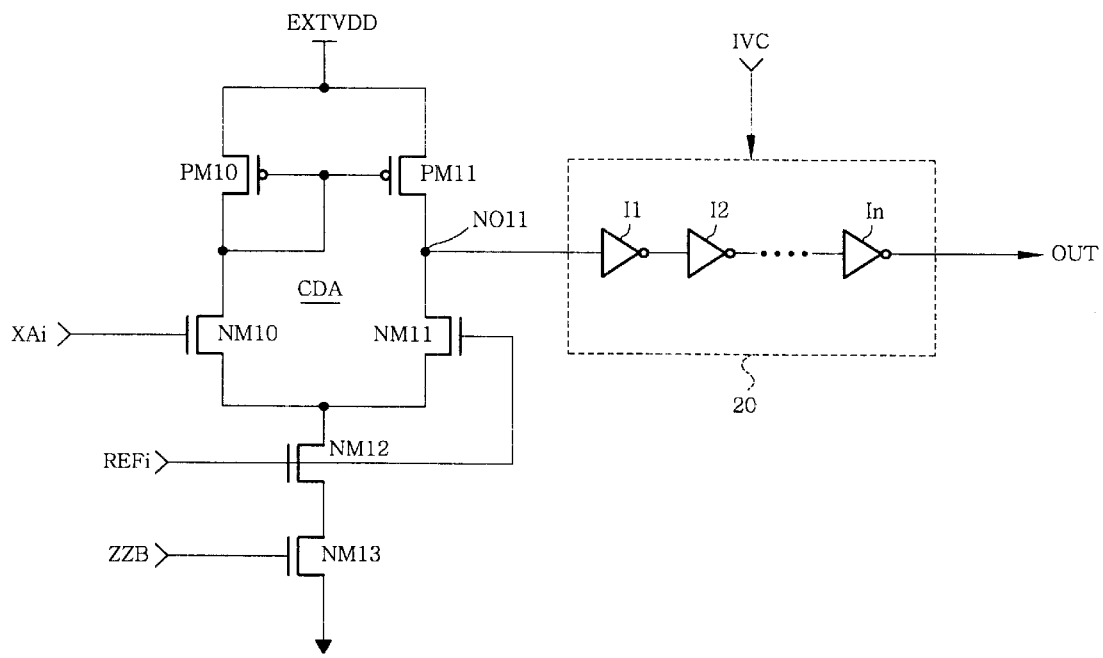
FIG. 2 is a circuit diagram of another conventional input receiver circuit.
Figure 3:
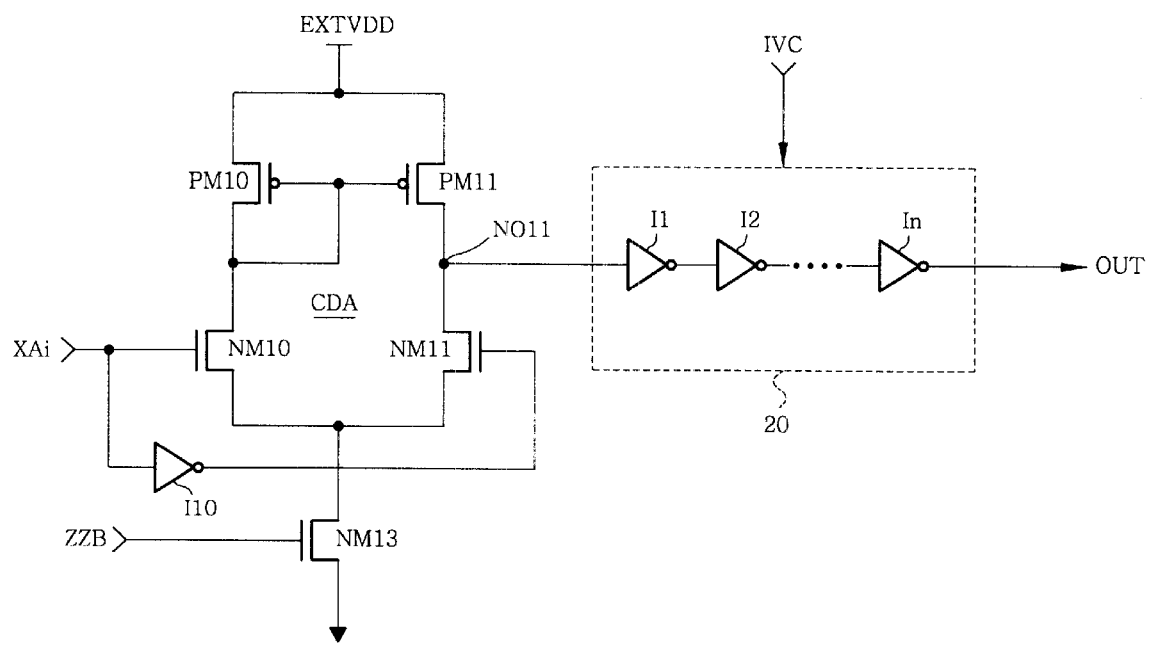
FIG. 3 is a circuit diagram of still another conventional input receiver circuit.

The input driver 100 includes a first, second, and third inverter (IN1, IN2, and IN3, respectively) preferably connected in series to produce a first and a second output signal (Aii and AiiB, respectively) having opposite phases to one another. An external power supply voltage EXTVDD is applied to input driver 100 as an operation voltage and buffering an input signal XAi to the level of EXTVDD. The cross-coupled sense amplifier 110 receives an internal power supply voltage IVC as an operation voltage when a control signal ZZB is in the first transition state, and performs differential amplification by receiving the first output signal, Aii, at a first input end and receiving the second output signal, AiiB, at a second input end. The cross-coupled sense amplifier 110 includes a pair of P channel cross-coupled transistors, P10 and P20, where a gate of one is cross-coupled to the drain of the other gate and vice versa. Further, the sources are commonly connected to the internal power supply voltage IVC; a pair of differential transistors (N10 and N20) receive the first and second output signal (Aii and AiiB), respectively, at their gates and form drain-source channels respectively between the drains of the pair of P channel cross-coupled transistors (P10 and P20) and a ground voltage. The N channel MOS transistor N30 receives the control signal ZZB at its gate, where its drain-source channel is connected between the common source terminal of the pair of differential transistors (N10 and N20) and the ground voltage. Here, the cross-coupled sense amplifier 110 does not need the reference signal REFi as shown in Prior Art FIGS. 2 and 3.

The output potential fixation element 120 includes a P channel MOS transistor P30, which receive the control signal ZZB through its gate. Its source-drain channel is connected between the internal power supply voltage and the output node NO10 to keep a potential of the output node NO10 of the cross-coupled sense amplifier 110 at a uniform potential corresponding to a level of the internal power supply voltage IVC when the control signal ZZB is in the second transition state.

The output driver 130 includes the fourth and fifth inverters (IN4 and IN5), preferably connected in series to the output node NOIO. The output device 130 is powered by the internal power supply voltage IVC as an operation voltage and to buffer the output signal rev at the output node NO10 with a level of the internal power supply voltage IVC as output signal Ai.

In a preferred embodiment of the present invention, the thickness of gate oxide films of the MOS transistors shown in the FIG. 4 is slightly thicker than a normal gate oxide film. This is accomplished by controlling the formation time of the gate oxide films in the complementary metal-oxide semiconductor (CMOS) manufacture process.

An operation according to the circuit of FIG. 4 will be explained for illustration. The control signal ZZB is applied at a low level. In case the input receiver is in a waiting mode, the control signal ZZB is applied at a low level for a standby current mode operation. Accordingly, the N channel MOS transistor N30 in the cross-coupled sense amplifier 110 is turned off and no operational current flows through the cross-coupled sense amplifier 110. And, the P channel MOS transistor P30 of the output potential fixation element 120 is turned on so that a potential of the output node NO10 is high, near the level of the internal power supply voltage IVC, whereby the output signal Ai is kept uniformly at a high state of the level of the internal power supply voltage IVC, regardless of the logic level of the input signal XAi.

When the control signal ZZB is changed to a high level from the low level, the input receiver enters an operation mode. As the control signal ZZB is applied at the high level, transistor P30 of the output potential fixation element 120 is turned off, and transistor N30 in the cross-coupled sense amplifier 110 is turned on. The driving output signal Ai is dependent on the logic levels of the input signal XAi.

In case a logic level of the input signal XAi is applied at a high level, outputs of the first, second, third inverters (IN1, IN2, and IN3 respectively) are at a low level, a high level and a low level, respectively. Here, the output at the high level of the second inverter IN2 becomes the first output signal (Aii) and the output at the low level of the third inverter IN3 becomes the second output signal (AiiB). The level of the first output signal Aii is a high level corresponding to the external power supply voltage EXTVDD because it has been driven with the external power supply voltage EXTVDD. The first output signal Aii at the high level is applied to a gate of the N channel MOS transistor N10, and the second output signal AiiB at the low level is applied to a gate of the N channel MOS transistor N20. Accordingly, the N channel MOS transistor N10 is turned on and the N channel MOS transistor N20 is turned off and the cross-coupled transistor P10 is turned off and the cross-coupled transistor P20 is turned on, whereby the signal rev of the output node NO10 reaches a high level, at about the internal power supply voltage IVC level. The circuit of FIG. 4 reduces a drive load to the driver prior to the output as compared with prior art circuits. The fourth inverter IN4 in the output driver 130 receives the output signal rev at the high level to output a low level signal and the fifth inverter IN5 receives the low level signal to provide a final drive output signal Ai at a high level to another circuit in the chip. Here, the output driver 130 buffers the output signal rev at the internal voltage level with a level of the internal voltage IVC to reduce its driving burden. As such, the time of propagation to output signal Ai is reduced. Further a reference voltage generating circuit which generates a reference signal is not needed.

Alternatively, when a logic level of the input signal XAi is applied at a low level, outputs of the first, the second, the third inverters (IN1, IN2, and IN3) become high level, low level and high level, respectively. The low level output of the second inverter IN2 is output as first output signal Aii and the high level output of the third inverter IN3 is output as the second output signal AiiB. The first output signal Aii at the low level is applied to the gate of the N channel MOS transistor N10, and the second output signal AiiB at the high level is applied to the gate of the N channel MOS transistor N20. Accordingly, the N channel MOS transistor N10 is turned off and the N channel MOS transistor N20 is turned on, and the cross-coupled transistor P10 is turned on and the cross-coupled transistor P20 is turned off, whereby the signal rev of the output node NO10 becomes a low level. Therefore, the signal rev of the output end NO10 swings from the high level to the low level, from about the level of the internal power supply voltage to ground. The fourth inverter IN4 in the output driver 130 receives the output signal rev at the low level to output a high level signal, and the fifth inverter IN5 receives the high level signal to provide a final driving output signal Ai at a low level to another circuit on the chip. Here, the output driver 130 buffers the output signal rev at the internal voltage level of the internal voltage IVC and to reduce its drive load.

Figure 5:
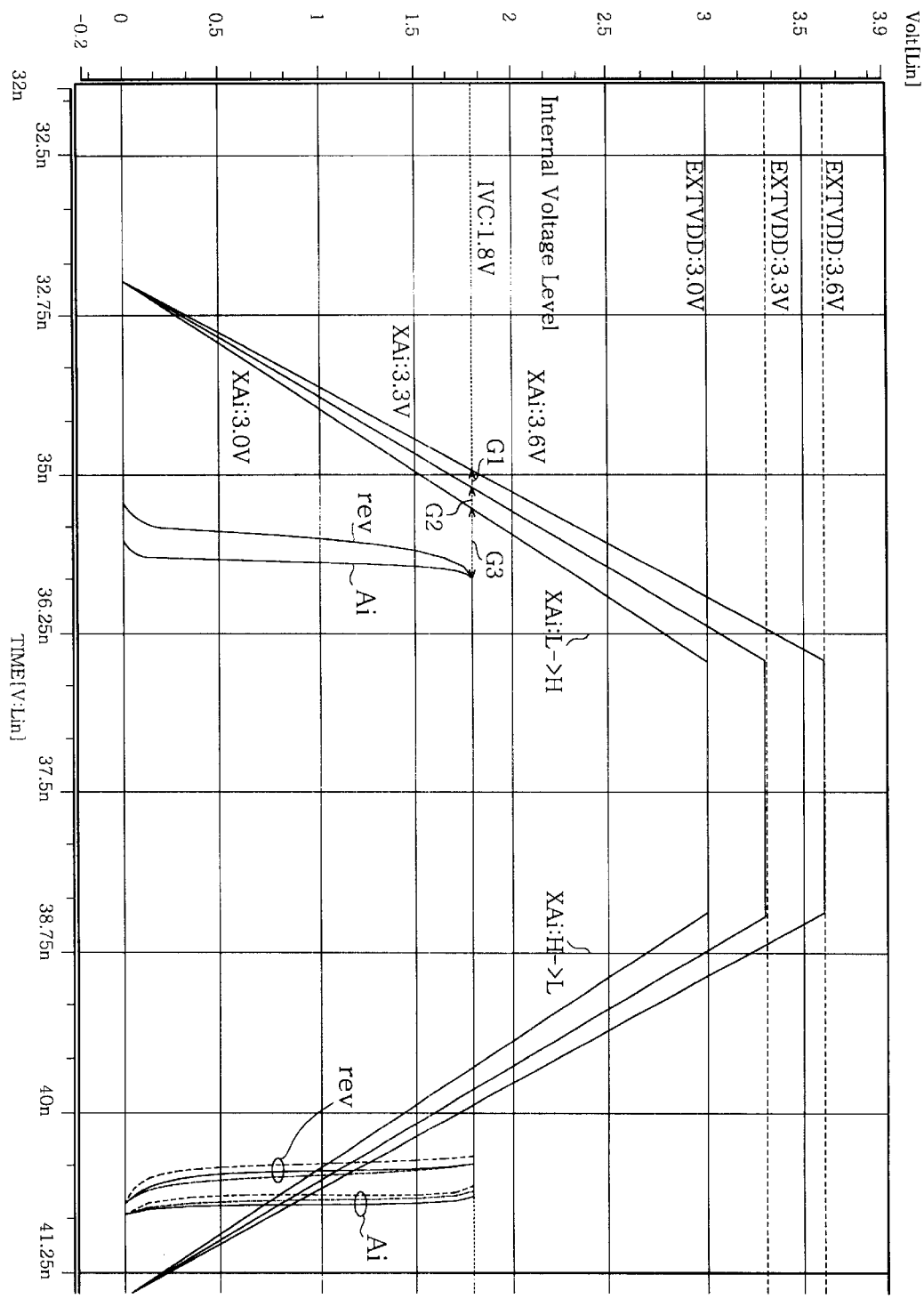
FIG. 5 is a diagram showing input and output signal waveforms according to the circuit of FIG. 4.

FIG. 5 is a graph showing input/output signals according to a circuit operation simulation of the input receiver of FIG. 4. When the external power supply voltage EXTVDD is respectively 3.6 volts, 3.3 volts and 3.0 volts and the internal voltage is 1.8 volt. Waveforms of the output signal rev and the driving output signal Ai are shown for the input signals XAi respectively applied with one of the three levels of the external power supply voltage. In this figure, the horizontal axis represents time and the longitudinal axis represents voltage. Also shown is that the driving output signal Ai, output before the voltage level of the input signal XAi reaches about 2.5 volts. Reference symbols G1, G2 and G3 represent the output response time of the driving output signal Ai with the three different external power supply voltages. For example, the output response time is at the G3 section when the external power supply voltage EXTVDD is used at 3.0 volts.

According to the above circuit, the setup/hold time requirement is satisfied in case the internal power supply voltage is less than the external power supply voltage EXTVDD minus a threshold voltage and a rising/falling time of an input signal is large, and a high level of the input signal is more than the internal power supply voltage plus a threshold voltage.

Various embodiments of the present invention have been described with respect to the figures, however, the scope of the invention is not to be limited to these figures as one skilled in the relevant art would recognize various modifications and alterations in light of the present disclosure without departing from the technical scope of this invention. For instance, the number of inverters or transistors in the circuit can be increased or decreased, and the MOS transistor element shown can be replaced with a bipolar transistor, and the opposite type of the transistor element can be used.

According to yet another embodiment of the present invention, the interface circuit is employed in a semiconductor using an external power supply voltage and an internal power supply voltage separately. Therefore, the setup/hold margin can be tightened by decreasing leakage current and maximizing its interface capability. Specially, the DC current consumption is small while satisfying a tight setup/hold time even when the internal power supply voltage is less than the external power supply voltage EXTVDD minus a threshold voltage and a rising/falling time of an input signal is large and a high level of the input signal is more than the internal power supply voltage plus a threshold voltage. Therefore, the present embodiment is advantageous when it is interfaced at a LVTTL or LVCMOS level in a high-speed semiconductor device.

Having described embodiments of an interface circuit and an interfacing method suitable for a high-speed semiconductor device, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claims and desired protected by Letters Patent is set for in the appended claims.

What is claimed is:

1. A semiconductor interface circuit comprising:

an input driver for producing a first and a second output signal having opposite phases to each other, said input driver being powered by an external power supply voltage;

a cross-coupled sense amplifier, powered by an internal power supply voltage, for performing differential amplification by receiving the first output signal at a first input and receiving the second output signal at a second input, wherein a channel transistor receives a control signal at its gate, where its drain-source channel is connected between a common source terminal of the pair of inputs and a ground voltage;

an output potential fixation element receiving the control signal through its gate with a source-drain channel connected between the internal power supply voltage and the output end for maintaining a potential of an output of the cross-coupled sense amplifier at a uniform potential proximal to a level of the internal power supply voltage when the output is at a high level; and an output driver, powered by the internal power supply voltage, for providing an output signal having a voltage level proximal to the level of the internal power supply voltage during an output mode, wherein the voltage of the internal power supply is lower than the voltage of the external power supply.

2. The interface circuit of claim 1, wherein the input driver comprises a first, a second, and a third inverter connected in series to the input signal.

3. The interface circuit of claim 1, wherein the channel transistor is an N channel metal-oxide semiconductor transistor, the cross-coupled sense amplifier further comprising:

a pair of P channel cross-coupled transistor wherein the gates of one transistor are cross-coupled to drains of the other and sources are commonly connected to the internal power supply voltage; and a pair of differential transistors for receiving the first and second output signal respectively at their gates and forming drain-source channels respectively between drains of the pair of P channel cross-coupled transistor and the ground voltage.

4. The interface circuit of claim 1, wherein the output potential fixation element comprises a P channel metal-oxide semiconductor transistor receiving the control signal through its gate with a source-drain channel connected between the internal power supply voltage and the output end.

5. The interface circuit of claim 1, wherein the output driver comprises a fourth and a fifth inverter connected in series to the output end.

6. The interface circuit of claim 1, wherein the interface circuit performs LVTTL interface.

* * * * *